United States Patent
Wang et al.

(10) Patent No.: US 12,050,487 B2
(45) Date of Patent: Jul. 30, 2024

(54) ELECTRONIC CIRCUITRY

(71) Applicants: KABUSHIKI KAISHA TOSHIBA, Tokyo (JP); Toshiba Electronic Devices & Storage Corporation, Tokyo (JP)

(72) Inventors: Kaili Wang, Yokohama Kanagawa (JP); Hiroaki Ishihara, Yokohama Kanagawa (JP)

(73) Assignees: KABUSHIKI KAISHA TOSHIBA, Minato-ku (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 9 days.

(21) Appl. No.: 17/903,714

(22) Filed: Sep. 6, 2022

(65) Prior Publication Data

US 2023/0297131 A1    Sep. 21, 2023

(30) Foreign Application Priority Data

Mar. 18, 2022   (JP) .................. 2022-044576

(51) Int. Cl.
    *G06F 13/42*    (2006.01)
    *G06F 1/10*     (2006.01)
    *G06F 1/12*     (2006.01)
    *H03K 17/691*   (2006.01)
    *G06F 1/14*     (2006.01)

(52) U.S. Cl.
    CPC .................. *G06F 1/12* (2013.01); *G06F 1/10* (2013.01); *H03K 17/691* (2013.01); *G06F 1/14* (2013.01)

(58) Field of Classification Search
    CPC ............ G06F 1/12; G06F 1/10; H03K 17/691
    USPC ......................................................... 713/400
    See application file for complete search history.

(56) References Cited

U.S. PATENT DOCUMENTS

| | | | | |
|---|---|---|---|---|
| 5,555,438 | A * | 9/1996 | Blech ............... | G06F 13/4027 710/61 |
| 7,715,726 | B2 * | 5/2010 | Chen ................. | H03M 3/368 398/154 |
| 9,972,196 | B2 * | 5/2018 | Mueck .............. | H04B 5/00 |
| 10,097,338 | B1 * | 10/2018 | Ng ..................... | G05F 1/561 |
| 10,389,434 | B1 * | 8/2019 | Getzin .............. | H04L 25/4906 |
| 11,810,044 | B1 * | 11/2023 | Singh ................ | G05B 19/41835 |
| 2013/0026849 | A1 * | 1/2013 | Ohta .................. | H02J 50/10 307/104 |

(Continued)

*Primary Examiner* — Volvick Derose
(74) *Attorney, Agent, or Firm* — Foley & Lardner LLP

(57) ABSTRACT

In one embodiment, electronic circuitry comprises a first circuit capable of transmitting and receiving signals, a second circuit capable of transmitting and receiving signals, and an insulation element. The first circuit has a first terminal to which a first clock signal is input, increases the frequency of the first clock signal to generate a second clock signal, and transmits the second clock signal. The insulation element transmits the second clock signal obtained from the first circuit to the second circuit as a third clock signal. The second circuit receives the third clock signal from the insulation element, and transmits a first data signal in response to the third clock signal. The insulation element transmits the first data signal obtained from the second circuit as a second data signal. The first circuit receives the second data signal from the insulation element.

18 Claims, 7 Drawing Sheets

(56) References Cited

U.S. PATENT DOCUMENTS

| | | | |
|---|---|---|---|
| 2013/0279611 A1* | 10/2013 | Mueck | G08C 25/00 375/259 |
| 2014/0361810 A1* | 12/2014 | Sasabe | H04L 25/0274 326/63 |
| 2016/0087914 A1* | 3/2016 | Goswami | H04B 5/0031 370/467 |
| 2017/0111162 A1* | 4/2017 | Koch | H04B 5/005 |
| 2018/0019747 A1* | 1/2018 | Ikegawa | H03K 17/168 |

* cited by examiner

ELECTRONIC CIRCUITRY

CROSS REFERENCE TO RELATED APPLICATIONS

This application is based upon and claims the benefit of priority from the prior Japanese Patent Application No. 2022-044576, filed on Mar. 18, 2022, the entire contents of which are incorporated herein by reference.

FIELD

Embodiments described herein generally relate to electronic circuitry.

BACKGROUND

Electronic circuitry capable of transmitting signals in both directions between two circuits is known, in which the two circuits are connected via an insulation element such as a voltage transformer or a current transformer.

Usually, such electronic circuitry includes two insulation elements, one of which is an insulation element for transmission from one circuit to the other circuit and the other of which is an insulation element for transmission from the other circuit to one circuit.

There is also electronic circuitry that uses a single insulation element to achieve bi-directional transmission. However, in exchange for the achievement of bi-directional transmission with a single insulation element, the electronic circuitry requires an additional circuit such as a reception timing circuit. As a result, the electronic circuitry does not have a simple configuration.

DETAILED DESCRIPTION

Figure 1:
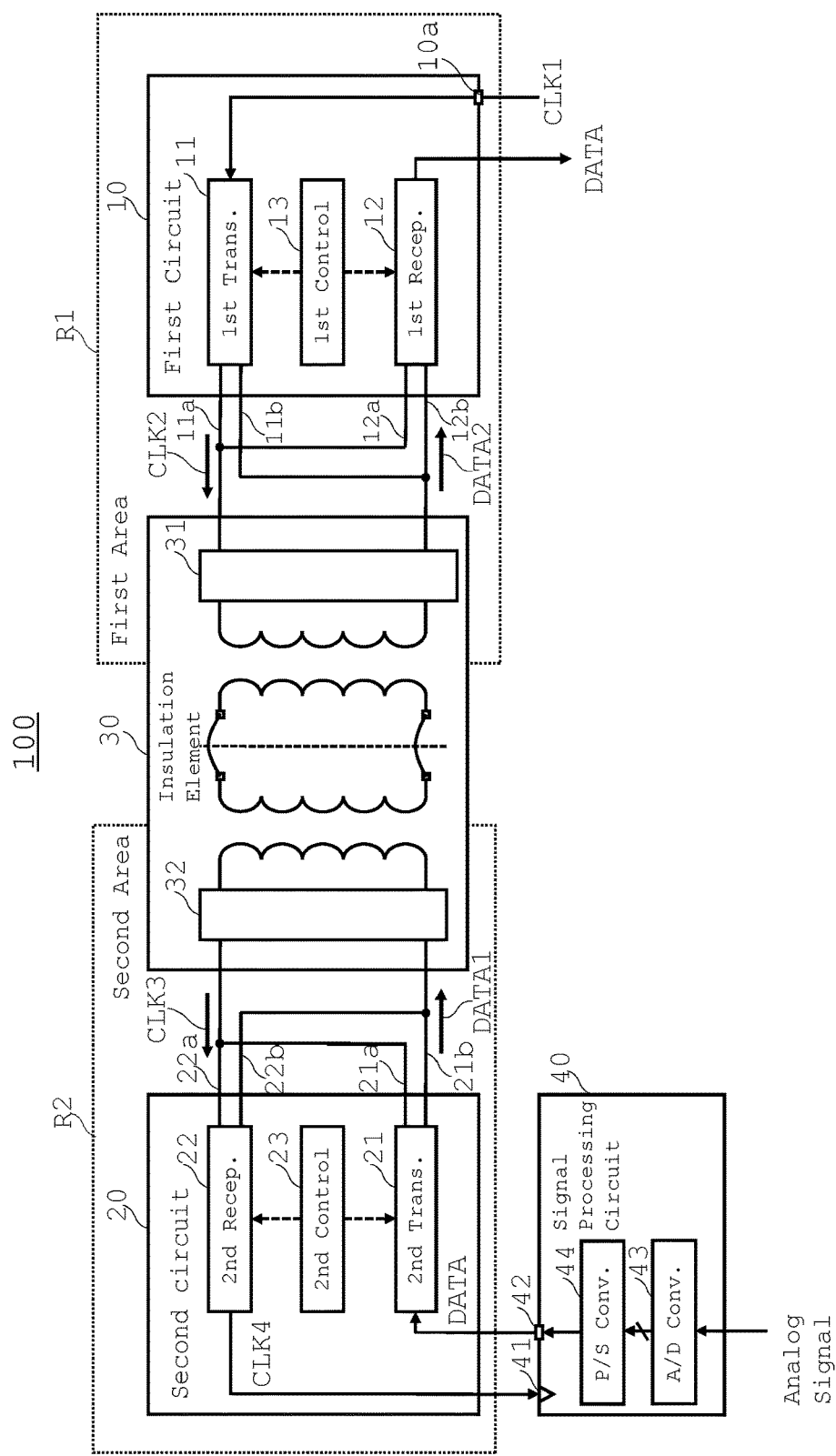
FIG. 1 shows a configuration of electronic circuitry according to a first embodiment.

Hereinafter, embodiments will be described with reference to attached drawings. The same or corresponding elements are denoted by the same reference numerals in the drawings and detailed description thereof will be omitted appropriately.

In general, according to one embodiment, electronic circuitry comprises a first circuit capable of transmitting and receiving signals, a second circuit capable of transmitting and receiving signals, and an insulation element. The first circuit has a first terminal to which a first clock signal is input, increases the frequency of the first clock signal to generate a second clock signal, and transmits the second clock signal. The insulation element transmits the second clock signal obtained from the first circuit to the second circuit as a third clock signal. The second circuit receives the third clock signal from the insulation element, and transmits a first data signal in response to the third clock signal. The insulation element transmits the first data signal obtained from the second circuit as a second data signal. The first circuit receives the second data signal from the insulation element.

First Embodiment

FIG. 1 shows a configuration of electronic circuitry 100 according to the first embodiment. The electronic circuitry 100 includes a first circuit 10 that can transmit and receive signals, a second circuit 20 that can transmit and receive signals, an insulation element 30 configured by a single voltage or current transformer, and a signal processing circuit 40. The first circuit 10 is arranged on a first area R1, and the second circuit 20 is arranged on a second area R2. The first circuit 10 and the second circuit 20 are connected via the insulation element 30. The first circuit 10 and the second circuit 20 are electrically insulated but are magnetically coupled. Therefore, signals output from one circuit are transmitted to the other circuit via the insulation element 30.

The first circuit 10 includes a first transmission circuit 11, a first reception circuit 12, and a first control circuit 13 that controls operations of these two circuits. Further, the first circuit 10 includes a first terminal 10a to which a first clock signal CLK1 is periodically input from the outside of the electronic circuitry 100. The first clock signal CLK1 is periodically input to the first transmission circuit 11 via the first terminal 10a. As described below, the first clock signal CLK1 is used, for example, to switch the operation mode of the first circuit 10. The first transmission circuit 11 has two output terminals 11a and 11b connected to a primary side 31 of the insulation element 30. Similarly, the first reception circuit 12 has two input terminals 12a and 12b connected to the primary side 31 of the insulation element 30.

In response to input of the first clock signal CLK1 to the first terminal 10a of the first circuit 10, the first circuit 10 increases the frequency of the first clock signal CLK1 to generate and transmit a second clock signal. The insulation element 30 transmits the second clock signal CLK2 obtained from the first circuit 10, as a third clock signal CLK3, with a slight time delay. The second circuit 20 receives the third clock signal CLK3 transmitted from the insulation element 30.

The first circuit 10 has two operation modes, which are a first transmission mode and a first reception mode. In the first transmission mode, the first transmission circuit 11 is in an operation state in which operation power is supplied to each circuit portion configured to perform signal transmission included therein and therefore electric power consumption occurs in the first transmission circuit 11. To the contrary, the first reception circuit 12 is in a stop state in which no operation power is supplied to each circuit portion configured to perform signal reception included therein and therefore electric power consumption does not occur in the first reception circuit 12. On the other hand, in the first reception mode, the first transmission circuit 11 is in a stop state in which no operation power is supplied to each circuit portion configured to perform signal transmission included therein and therefore electric power consumption does not occur in the first transmission circuit 11. To the contrary, the first reception circuit 12 is in an operation state in which operation power is supplied to each circuit portion configured to perform signal reception included therein and therefore electric power consumption occurs in the first reception circuit 12. In the first transmission circuit 11 and the first reception circuit 12, operation power is constantly supplied to each circuit portion configured to receive control signals from the control circuit 13 in each of the operation state and the stop state.

The second circuit 20 includes a second transmission circuit 21, a second reception circuit 22, and a second control circuit 23 that controls operations of these two circuits. The second transmission circuit 21 receives a data signal DATA from the signal processing circuit 40. The third clock signal CLK3 received by the second reception circuit 22 becomes a fourth clock signal CLK4 after its frequency is reduced, and is input to a clock terminal 41 of the signal processing circuit 40. The above-described first clock signal CLK1 is a clock signal input from the outside of the electronic circuitry 100. On the other hand, the second clock signal CLK2 and the third clock signal CLK3 are clock signals to be used in the electronic circuitry 100. The third clock signal CLK3 is used, for example, by the second circuit 20 to output the data signal DATA. The second transmission circuit 21 has two output terminals 21a and 21b connected to a secondary side 32 of the insulation element 30. The second reception circuit 22 has two input terminals 22a and 22b connected to the secondary side 32 of the insulation element 30.

The second circuit 20 has two operation modes, which are a second transmission mode and a second reception mode. In the second transmission mode, the second transmission circuit 21 is in an operation state in which operation power is supplied to each circuit portion configured to perform signal transmission included therein and therefore electric power consumption occurs in the second transmission circuit 21. To the contrary, the second reception circuit 22 is in a stop state in which no operation power is supplied to each circuit portion configured to perform signal reception included therein and therefore electric power consumption does not occur in the second reception circuit 22. On the other hand, in the second reception mode, the second transmission circuit 21 is in a stop state in which no operation power is supplied to each circuit portion configured to perform signal transmission included therein and therefore electric power consumption does not occur in the second transmission circuit 21. To the contrary, the second reception circuit 22 is in an operation state in which operation power is supplied to each circuit portion configured to perform signal reception included therein and therefore electric power consumption occurs in the second reception circuit 22. In the second transmission circuit 21 and the second reception circuit 22, operation power is constantly supplied to a circuit portion configured to receive control signals from the control circuit 23 in each of the operation state and the stop state.

The signal processing circuit 40 outputs a 1-bit data signal DATA having a value of 0 or 1 from an output terminal 42 every time when the fourth clock signal CLK4 is input to the clock terminal 41. Specifically, the signal processing circuit 40 includes an analog/digital (A/D) converter 43 and a parallel/serial (P/S) converter 44. The A/D converter 43 converts an analog signal input from the outside into a multi-bit digital signal and outputs the converted signal. The P/S converter 44 converts the multi-bit digital signal output from the A/D converter 43, i.e., a parallel bit signal, into a serial bit signal and outputs the converted signal. The serial bit signal generated from the P/S converter 44 is output bit by bit from the output terminal 42, as the data signal DATA, every time when the fourth clock signal CLK4 is input to the clock terminal 41.

The analog signal input to the signal processing circuit 40 is not particularly limited in type and may be a sensor signal output from a current sensor or a voltage sensor, as an example. In this case, the electronic circuitry 100 functions as a voltage measurement circuit or a current measurement circuit, which transmits a voltage value or a current value to be measured from the first circuit 10 to the second circuit 20 via the insulation element 30. Further, the A/D converter 43 is not particularly limited in specific configuration. As an example, the A/D converter 43 can be configured by a delta-sigma modulator.

The second circuit 20 increases the frequency of the data signal DATA output from the output terminal 42 of the signal processing circuit 40 and transmits the frequency-increased signal as a first data signal DATA1. The insulation element 30 transmits the first data signal DATA1 obtained from the second circuit 20, as a second data signal DATA2, with a slight time delay. The first circuit 10 receives the second data signal DATA2 transmitted from the insulation element 30. The first circuit 10 reduces the frequency of the received second data signal DATA2 to restore the original data signal DATA.

Next, the outline of operations that can be performed by the electronic circuitry 100 according to the first embodiment will be described with reference to the timing chart of FIG. 2. In the initial state illustrated in FIG. 2, i.e., at the left edge of the timing chart, the first circuit 10 is in the first reception mode, and the second circuit 20 is in the second reception mode.

At time t1, in response to input of the first clock signal CLK1, the first circuit 10 is switched from the first reception mode to the first transmission mode and transmits the second clock signal CLK2 (S1). Subsequently, at time t5, the first circuit 10 is switched from the first transmission mode to the first reception mode. The insulation element 30 transmits the second clock signal CLK2 obtained from the first circuit 10, as the third clock signal CLK3, with a slight time delay.

The second circuit 20 is switched from the second reception mode to the second transmission mode in response to reception of the third clock signal CLK3 from the insulation element 30 (S2), and transmits the first data signal DATA1 (S3). Subsequently, at time t10, the second circuit 20 is switched from the second transmission mode to the second reception mode. The insulation element 30 transmits the first data signal DATA1 obtained from the second circuit 20, as the second data signal DATA2, with a slight time delay.

The first circuit 10 receives the second data signal DATA2 transmitted from the insulation element 30 (S4). Subsequently, at time t11, when the first clock signal CLK1 is input again, the first circuit 10 is switched again from the first reception mode to the first transmission mode, and thereafter, the above-described operation is repeated every time when the first clock signal CLK1 is input.

Figure 2:
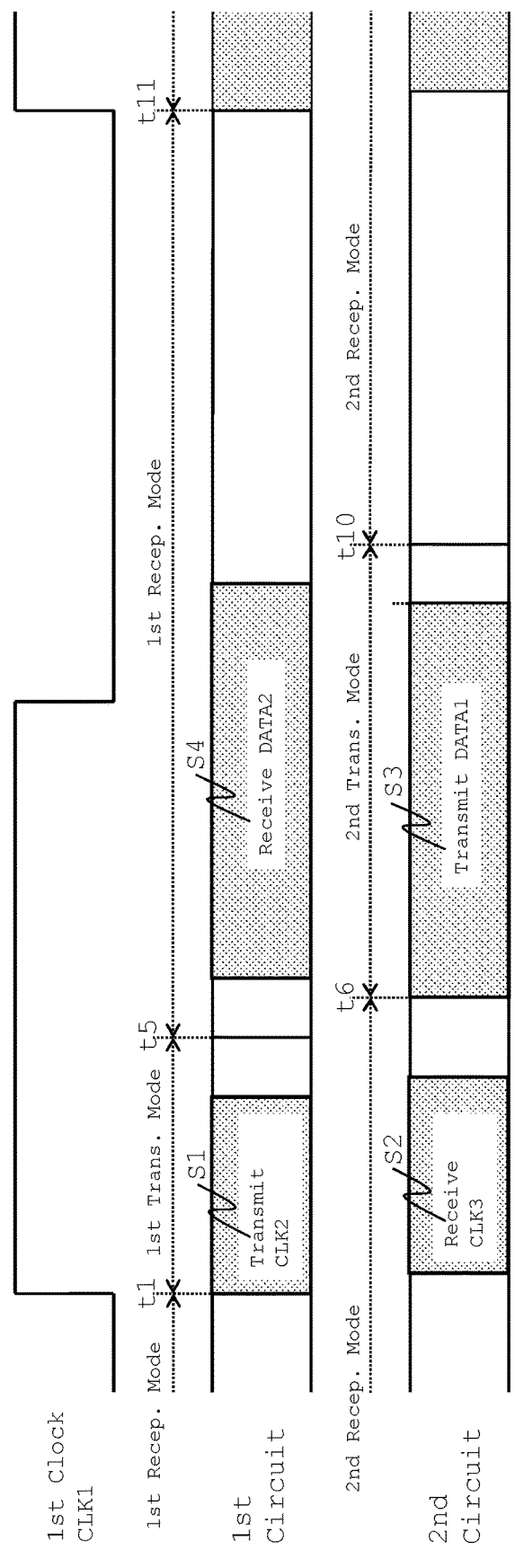
FIG. 2 is a timing chart schematically illustrating operations of the electronic circuitry according to the first embodiment.
Figure 3:
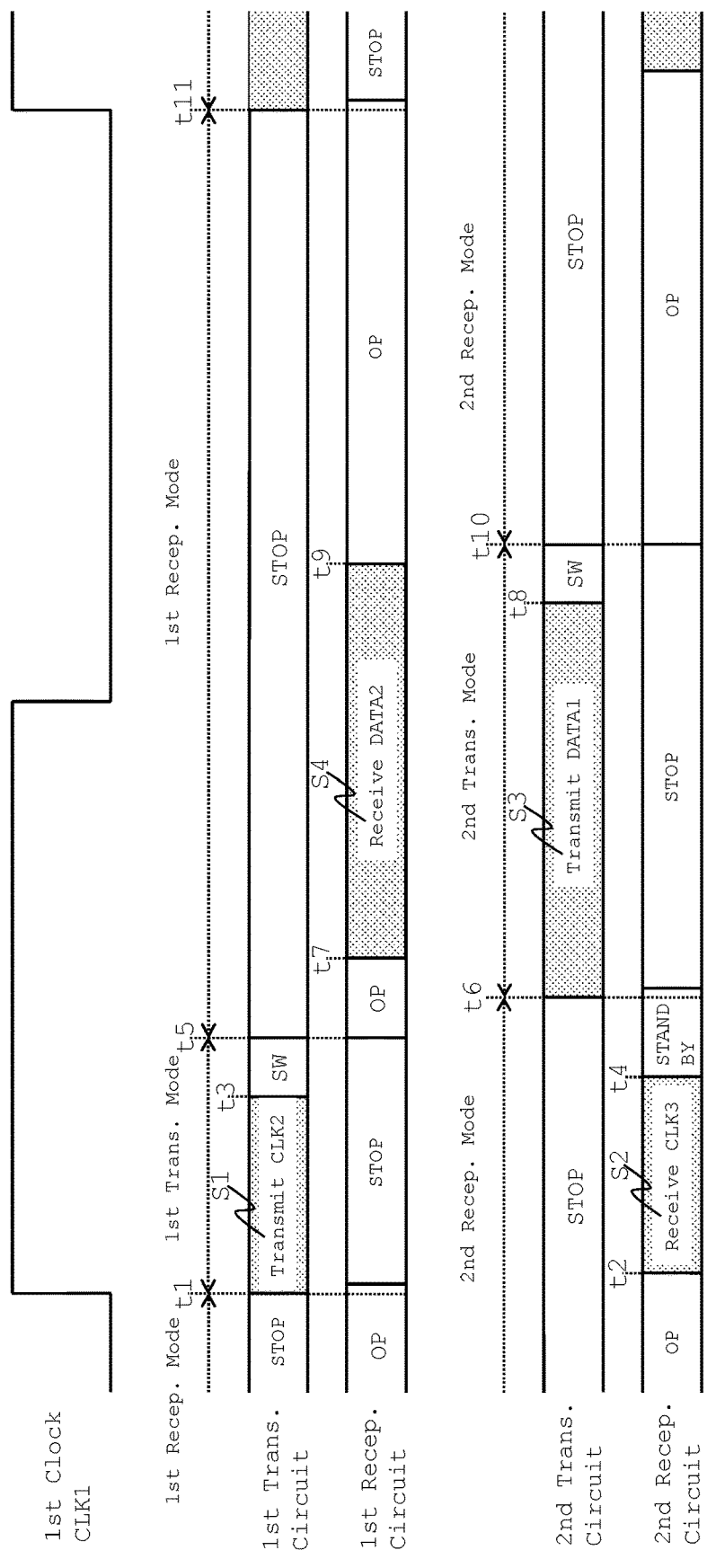
FIG. 3 is a timing chart illustrating detailed operations of the electronic circuitry according to the first embodiment.

FIG. 3 illustrates details of operations performed by the first transmission circuit 11 and the first reception circuit 12 included in the first circuit 10 and the second transmission circuit 21 and the second reception circuit 22 included in the second circuit 20, which correspond to the operations of the timing chart in FIG. 2. Hereinafter, the operations of the electronic circuitry 100 according to the first embodiment will be described in detail with reference to the timing chart of FIG. 3. In FIG. 3, "OP" refers to the operation state and "STOP" refers to the stop state.

First, in the first embodiment, the first to fourth clock signals CLK1 to CLK4, the data signal DATA, and the first to second data signals DATA1 to DATA2 are respectively a voltage pulse or a current pulse. Further, the determination with respect to the reception of each of the first clock signal CLK1 and the third clock signal CLK3 is performed by detecting a positive edge (rising edge) of the pulse.

In the initial state illustrated in FIG. 3, i.e., at the left edge of the timing chart, the first circuit 10 is in the first reception mode. Accordingly, the first transmission circuit 11 is in the stop state and the first reception circuit 12 is in the operation state. Further, the second circuit 20 is in the second reception mode. Accordingly, the second transmission circuit 21 is in the stop state and the second reception circuit 22 is in the operation state.

At time t1, in response to input of the first clock signal CLK1, the first circuit 10 is switched from the first reception mode to the first transmission mode. Specifically, the first control circuit 13 starts supplying operation power to each circuit portion configured to perform signal transmission included in the first transmission circuit 11, thereby bringing the first transmission circuit 11 into the operation state. Further, the first control circuit 13 stops supplying operation power to each circuit portion configured to perform signal reception included in the first reception circuit 12, thereby bringing the first reception circuit 12 into the stop state. In this state, the first transmission circuit 11 transmits the second clock signal CLK2 (S1).

At time t3 when the transmission of the second clock signal CLK2 has completed, the first circuit 10 is switched from the first transmission mode to the first reception mode. Specifically, the first control circuit 13 stops supplying operation power to each circuit portion configured to perform signal transmission included in the first transmission circuit 11, thereby bringing the first transmission circuit 11 into the stop state. Further, the first control circuit 13 starts supplying operation power to each circuit portion configured to perform signal reception included in the first reception circuit 12, thereby bringing the first reception circuit 12 into the operation state. However, since it requires a certain amount of waiting time until the residual transmission signal of the first transmission circuit 11 attenuates and disappears and therefore a predetermined time is required for the switching. In FIG. 3, the time period from time t3 to time t5 for the "switching" corresponds to this. The time for the switching is preliminary determined as a designed value.

On the other hand, in the time period from time t2 to time t4, the second reception circuit 22 of the second circuit 20 receives the third clock signal CLK3 transmitted from the insulation element 30 (S2). The second reception circuit 22 changes the received third clock signal CLK3 into the fourth clock signal CLK4 by reducing the frequency thereof, and then inputs the fourth clock signal CLK4 to the clock terminal 41 of the signal processing circuit 40. As a result, the 1-bit data signal DATA having a value of 0 or 1 is output from the output terminal 42 of the signal processing circuit 40. This data signal DATA is input to the second transmission circuit 21. The data signal DATA output from the signal processing circuit 40 is continuously held at the same value until the fourth clock signal CLK4 is input again. Further, in FIG. 3, each of the time difference between time t1 and time t2 and the time difference between time t3 and time t4 represents a delay occurring in the process of transmitting the second clock signal CLK2 via the insulation element 30.

When the reception of the third clock signal CLK3 has completed at time t4, the second reception circuit 22 is brought into a standby state for a certain period of time until the residual transmission signal of the first transmission circuit 11 of the first circuit 10 attenuates and disappears. In FIG. 3, the time period from time t4 to time t6 corresponds to this standby state. The standby time is preliminary determined as a designed value.

At time t6, the second circuit 20 is switched from the second reception mode to the second transmission mode. Specifically, the second control circuit 23 starts supplying operation power to each circuit portion configured to perform signal transmission included in the second transmission circuit 21, thereby bringing the second transmission circuit 21 into the operation state. To the contrary, the second control circuit 23 stops supplying operation power to each circuit portion configured to perform signal reception included in the second reception circuit 22, thereby bringing the second reception circuit 22 into the stop state. In this state, the second transmission circuit 21 transmits the first data signal DATA1 (S3). The first data signal DATA1 is the signal obtained by increasing the frequency of the data signal DATA output from the output terminal 42 of the signal processing circuit 40, when the fourth clock signal CLK4 was input to the clock terminal 41 of the signal processing circuit 40.

At time t8 when the transmission of the first data signal DATA1 has completed, the second circuit 20 is switched from the second transmission mode to the second reception mode. Specifically, the second control circuit 23 stops supplying operation power to each circuit portion configured to perform signal transmission included in the second transmission circuit 21, thereby bringing the second transmission circuit 21 into the stop state. To the contrary, the second control circuit 23 starts supplying operation power to each circuit portion configured to perform signal transmission included in the second reception circuit 22, thereby bringing the second reception circuit 22 into the operation state. Even in this case, since it requires a certain amount of waiting time until the residual transmission signal of the second transmission circuit 21 attenuates and disappears, a predetermined time is required for the switching. In FIG. 3, the time period from time t8 to time t10 for the "SW" corresponds to this. The time for the switching is preliminary determined as a designed value. However, it is necessary to complete this switching before the third clock signal CLK3 is received next time.

On the other hand, in the time period from time t7 to time t9, the first reception circuit 12 of the first circuit 10 receives the second data signal DATA2 transmitted from the insulation element 30 (S4). The first reception circuit 12 reduces the frequency of the received second data signal DATA2 to restore the data signal DATA and then outputs the restored signal to the outside of the electronic circuitry 100, so that the data signal DATA can be used in various ways depending on the purpose. As an example, the analog signal input to the signal processing circuit 40 is a sensor signal output from a voltage or current sensor. When the electronic circuitry 100 functions as a voltage or current measurement circuit, the data signal DATA forms part of the digital representation of a voltage or current value to be measured, in this case. Even after the reception of the second data signal DATA2 is completed, the first circuit 10 continuously holds the first reception mode to wait until the first clock signal CLK1 is input again.

At time t11 when the first clock signal CLK1 is input again, the first circuit 10 is again switched from the first reception mode to the first transmission mode, and thereafter the above-described operation is repeated every time when the first clock signal CLK1 is input. As a result, every time when the first clock signal CLK1 is input, the first circuit 10 can repetitively receive the frequency-increased second data signal DATA2 corresponding to the 1-bit data signal DATA from the second circuit 20 via the insulation element 30.

As described above, in the electronic circuitry 100 according to the first embodiment, the first circuit 10 includes the first terminal 10a to which the first clock signal CLK1 is input, and increases the frequency of the first clock signal CLK1 to generate and transmit the second clock signal CLK2 (S1). The insulation element 30 transmits the second clock signal CLK2 obtained from the first circuit 10 as the third clock signal CLK3. The second circuit 20 receives the third clock signal CLK3 transmitted from the insulation element 30 (S2), and transmits the first data signal DATA1 according to the third clock signal CLK3 (S3). The insulation element 30 transmits the first data signal DATA1 obtained from the second circuit 20 as the second data signal DATA2. The first circuit 10 receives the second data signal DATA2 transmitted from the insulation element 30 (S4).

The electronic circuitry 100 according to the first embodiment having the above-described features has a simple circuit configuration and can achieve bi-directional transmission.

Further, the first circuit 10 has two operation modes, which are the first transmission mode and the first reception mode. In the first transmission mode, only the first transmission circuit 11 is in the operation state in which operation power is supplied to each circuit portion configured to perform signal transmission included therein and therefore electric power consumption occurs in the first transmission circuit 11. To the contrary, the first reception circuit 12 is in the stop state in which no operation power is supplied to each circuit portion configured to perform signal reception included therein and therefore electric power consumption does not occur in the first reception circuit 12. On the other hand, in the first reception mode, the first reception circuit 12 is in the operation state in which operation power is supplied to each circuit portion configured to perform signal reception included therein and therefore electric power consumption occurs in the first reception circuit 12. To the contrary, the first transmission circuit 11 is in the stop state in which no operation power is supplied to each circuit portion configured to perform signal transmission included therein and therefore electric power consumption does not occur in the first transmission circuit 11.

Similarly, the second circuit 20 has two operation modes, which are the second transmission mode and the second reception mode. In the second transmission mode, only the second transmission circuit 21 is in the operation state in which operation power is supplied to each circuit portion configured to perform signal transmission included therein and therefore electric power consumption occurs in the second transmission circuit 21. To the contrary, the second reception circuit 22 is in the stop state in which no operation power is supplied to each circuit portion configured to perform signal reception included therein and therefore electric power consumption does not occur in the second reception circuit 22. On the other hand, in the second reception mode, only the second reception circuit 22 is in the operation state in which operation power is supplied to each circuit portion configured to perform signal reception included therein and therefore electric power consumption occurs in the second reception circuit 22. To the contrary, the second transmission circuit 21 is in the stop state in which no operation power is supplied to each circuit portion configured to perform signal reception included therein and therefore electric power consumption does not occur in the second transmission circuit 21.

The above-described features enable the single insulation element 30 to perform bi-directional transmission between the first circuit 10 and the second circuit 20, specifically the transmission of the second clock signal CLK2 and the first data signal DATA1. As a result, the number of components or parts can be reduced as compared with the conventional electronic circuitry using two insulation elements. In addition, the electric power consumed in the first circuit 10 is low not only because the first reception circuit 12 is not operating while the first transmission circuit 11 is operating but also because the first transmission circuit 11 is not operating while the first reception circuit 12 is operating. Similarly, the electric power consumed in the second circuit 20 is low not only because the second reception circuit 22 is not operating while the second transmission circuit 21 is operating but also because the second transmission circuit 21 is not operating while the second reception circuit 22 is operating.

Further, in the first transmission mode, the first circuit 10 is switched to the first reception mode after a predetermined switching time (time period from time t3 to time t5 in FIG. 3) has elapsed since completion of the transmission of the second clock signal CLK2. Similarly, in the second reception mode, the second circuit 20 is switched to the second transmission mode after a predetermined standby time (time period from time t4 to time t6 in FIG. 3) has elapsed since completion of the reception of the third clock signal CLK3. The above-described features make it possible to transmit the first data signal DATA1 without being affected by the residual transmission signal of the first transmission circuit 11.

Second Embodiment

In the above-described first embodiment, the first circuit 10 has two operation modes, which are the first transmission mode and the first reception mode. To the contrary, the first circuit 10 according to a second embodiment has a first standby mode, in addition to the first transmission mode and the first reception mode. In the first standby mode, each of the first transmission circuit 11 and the first reception circuit 12 is in a stop state.

Figure 4:
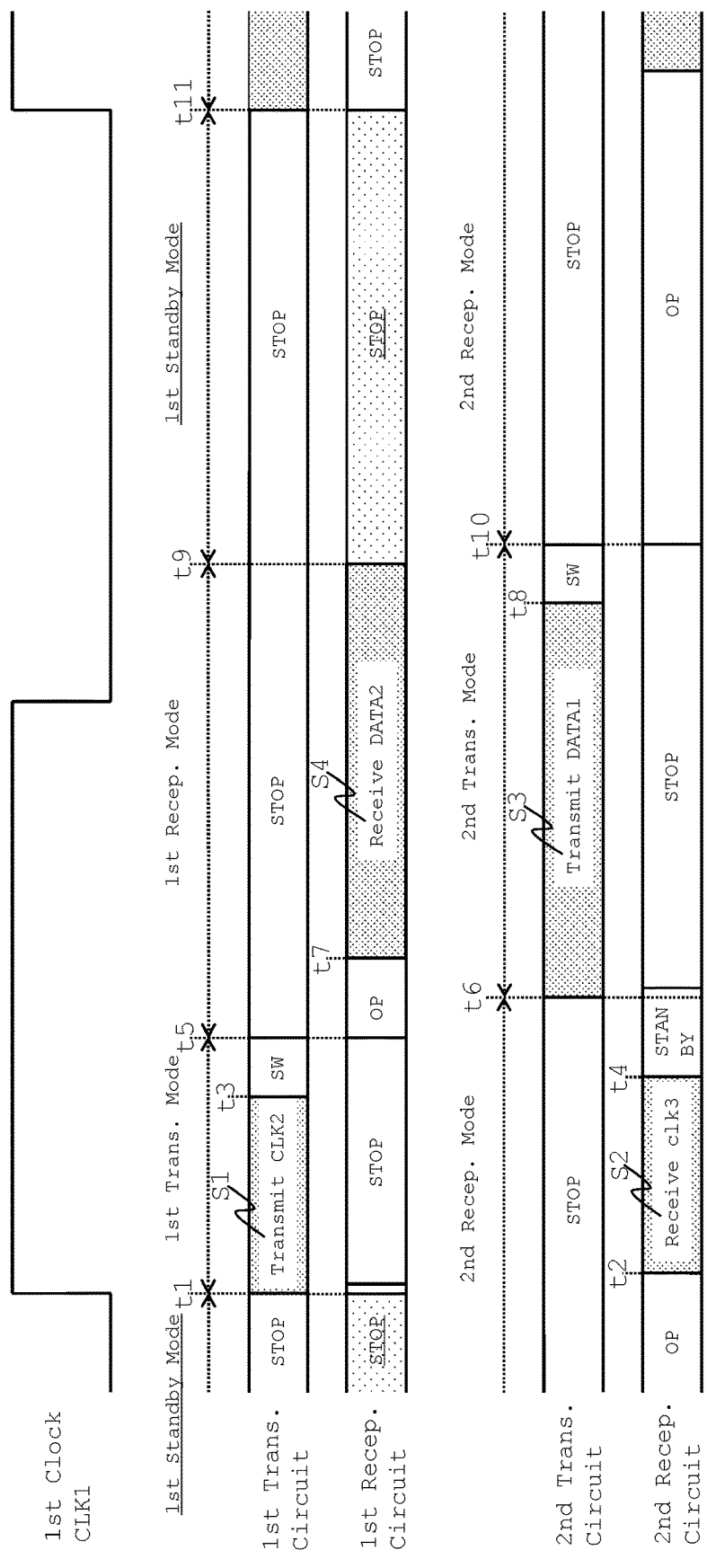
FIG. 4 is a timing chart illustrating operations of electronic circuitry according to a second embodiment.

In the initial state illustrated in FIG. 4, i.e., at the left edge of the timing chart, the first circuit 10 is in the first standby mode. Accordingly, each of the first transmission circuit 11 and the first reception circuit 12 is a stop state, i.e. not operating.

At time t1 when the first clock signal CLK1 is input, the first circuit 10 is switched from the first standby mode to the first transmission mode. Specifically, the first control circuit 13 brings the first transmission circuit 11 into an operation state and holds the stop state of the first reception circuit 12. After that, the operation until time t9 is the same as that of the first embodiment.

At time t9 when the reception of the second data signal DATA2 has completed, the first circuit 10 is switched from the first reception mode to the first standby mode. Specifically, the first control circuit 13 brings the first transmission circuit 11 and the first reception circuit 12 into the stop state.

At time t11 when the first clock signal CLK1 is input again, the first circuit 10 is switched again from the first standby mode to the first transmission mode, and thereafter the above-described operation is repeated every time when the first clock signal CLK1 is input.

As described above, in the electronic circuitry 100 according to the second embodiment, the first circuit 10 has the first standby mode in addition to the first transmission mode and the first reception mode. In the first standby mode, each of the first transmission circuit 11 and the first reception circuit 12 is in the stop state, i.e. not operating.

In the above-described first embodiment, it is configured to set the first reception mode in the time period from the initial state (left edge) to time t1 and the time period from time t9 to time t11 in FIG. 3. Accordingly, although the first transmission circuit 11 is not operating, the first reception circuit is operating, and accordingly electric power is consumed in the first reception circuit 12. On the contrary, in the second embodiment, the first standby mode is set in the time period from the initial state (left edge) to time t1 and the time period from time t9 to time t11 in FIG. 4. Accordingly, both of the first transmission circuit 11 and the first reception circuit 12 are not operating, and accordingly the electric power consumed by the first circuit 10 becomes further lower than that in the first embodiment. As a result, the electric power consumed in the electronic circuitry 100 according to the second embodiment is further lower than that in the first embodiment.

Third Embodiment

In the above-described first embodiment, the second circuit 20 is configured to be switched from the second transmission mode to the second reception mode, at time t8 when the transmission of the first data signal DATA1 has completed. However, if an error occurs and the mode switching is failed, the second circuit 20 may be continuously fixed in the second transmission mode. In this case, the next third clock CLK3 cannot be received, and as a result, the transmission of the first data signal DATA1 from the second circuit 20 to the first circuit 10 will be stopped. As a safety measure against such an event, in the electronic circuitry 100 according to the third embodiment, the second circuit 20 is switched to the second reception mode when the second transmission mode continues for a predetermined time. Specifically, when the elapse of a predetermined time-out time is detected by an internal timer circuit, the second control circuit 23 brings the second transmission circuit 21 into the stop state and also brings the second reception circuit 22 into the operation state.

Figure 5:
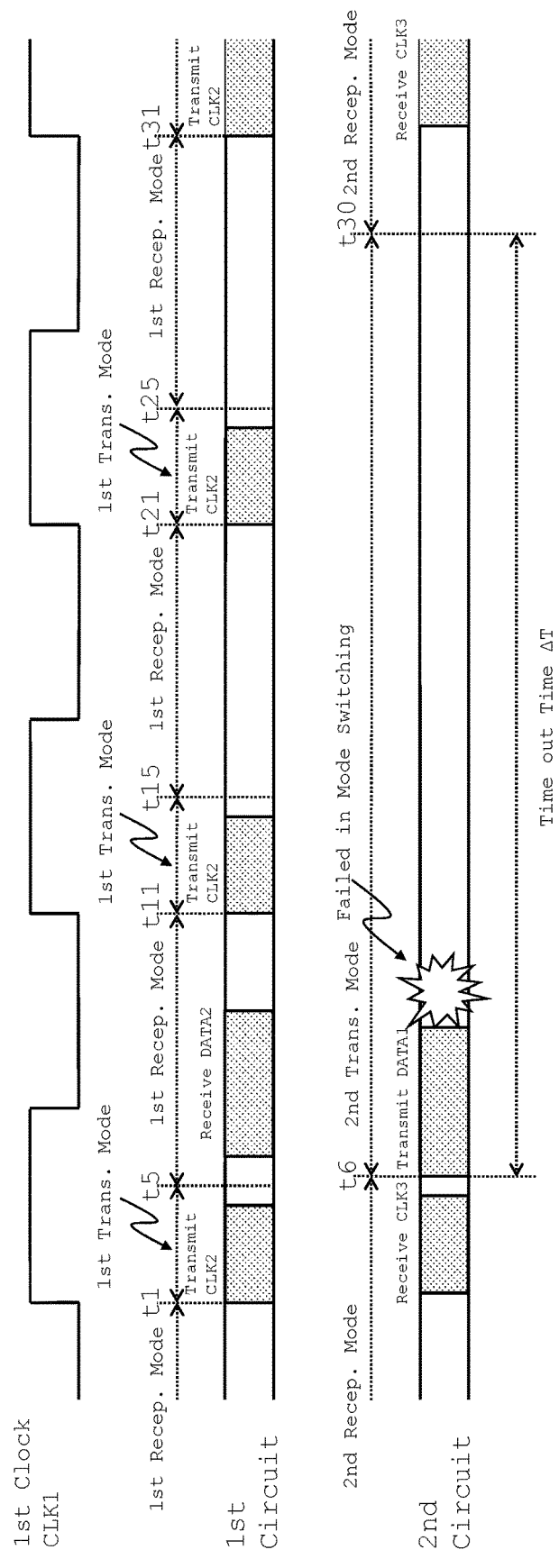
FIG. 5 is a timing chart illustrating operations of electronic circuitry according to a third embodiment.

According to the example illustrated in FIG. 5, the second control circuit 23 causes the internal timer to start at the timing when the mode is switched to the second transmission mode at time t6. When the elapse of predetermined time-out time ΔT is detected by the internal timer, the second control circuit 23 brings the second transmission circuit 21 into the stop state and also brings the second reception circuit 22 into the operation state, at time t30. Here, the predetermined time-out time ΔT is preliminary determined as a value obtained by adding a desired margin to the time usually required for the transmission of the first data signal DATA1.

As described above, in the electronic circuitry 100 according to the third embodiment, the second circuit 20 is switched to the second reception mode when the second transmission mode continues for a predetermined time. This prevents the second circuit 20 from being continuously fixed in the second transmission mode. According to the example illustrated in FIG. 5, the second circuit 20 cannot return the first data signal DATA1 in response to the 2nd and 3rd third clock signals CLK3 received from the first circuit 10.

However, the usual state in which the first data signal DATA1 can be returned resumes from the 4th third clock signal CLK3.

Modified Embodiments

Figure 6:
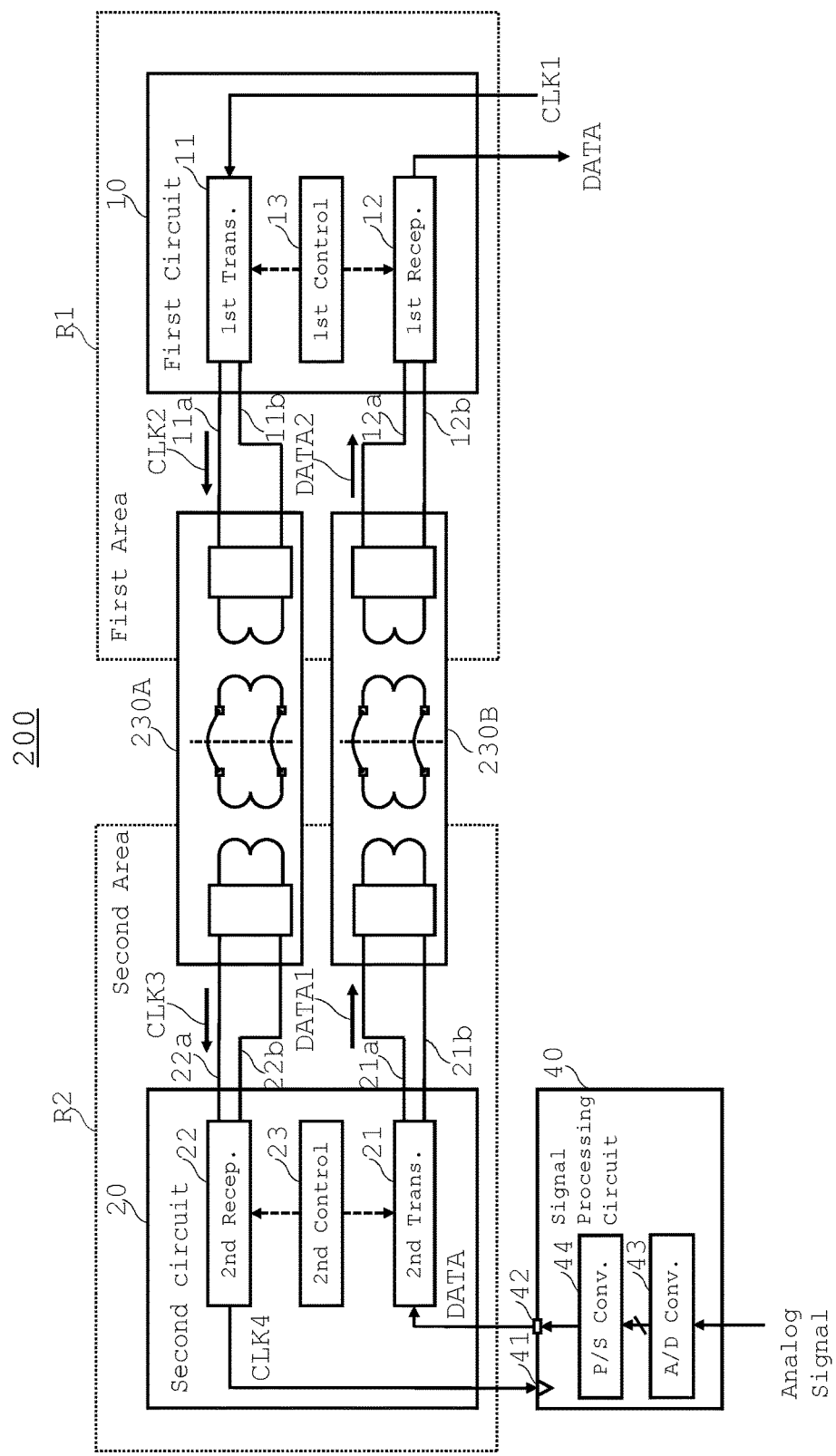
FIG. 6 shows a configuration of electronic circuitry according to a first modified embodiment.
Figure 7:
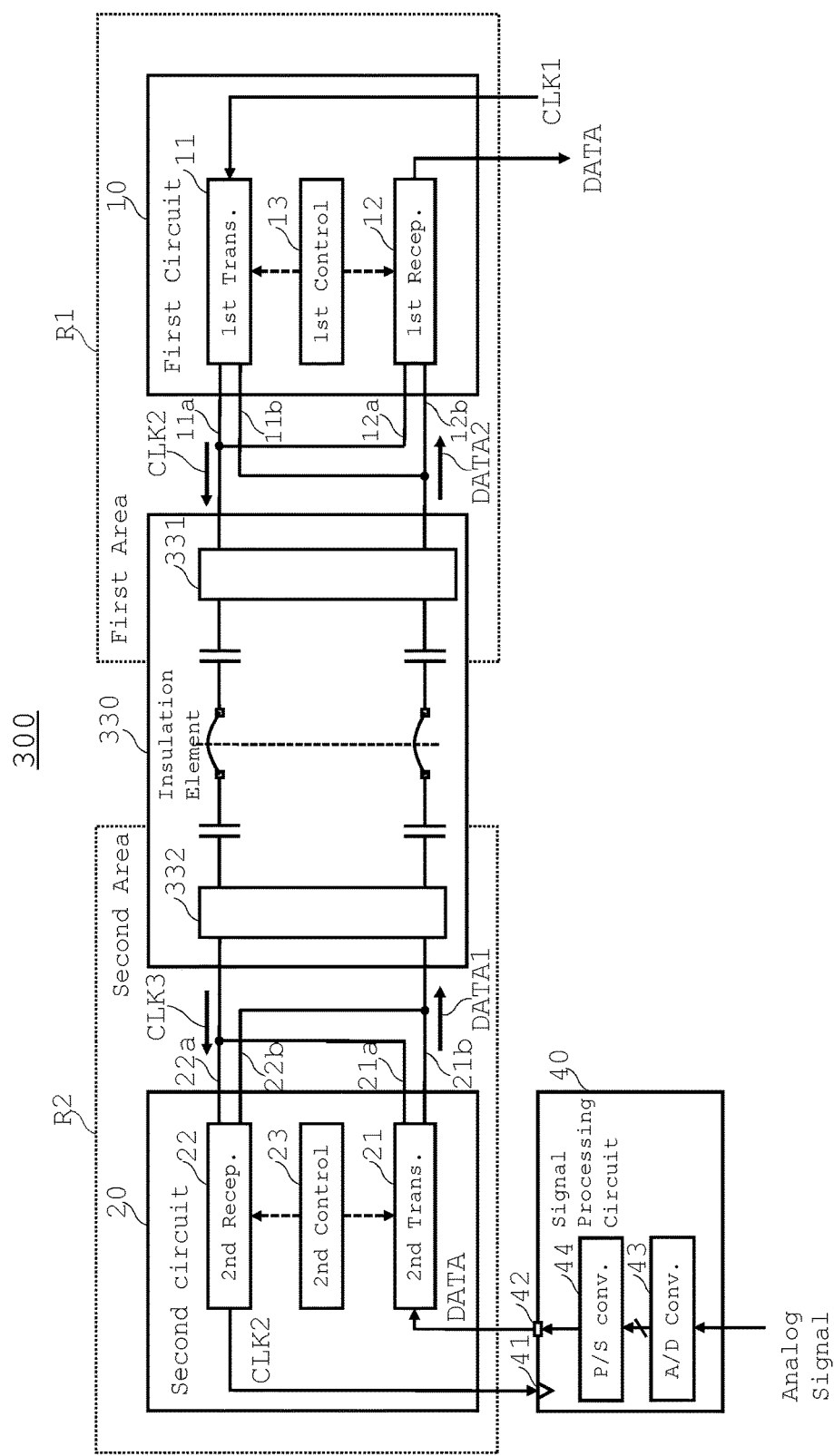
FIG. 7 shows a configuration of electronic circuitry according to a second modified embodiment.

In the above-described first to third embodiments, the bi-directional transmission is achieved by the single insulation element 30. However, it does not mean that two or more insulation elements cannot be used. As an example, as illustrated in FIG. 6, the single insulation element 30 may be replaced by a first insulation element 230A and a second insulation element 230B, so that the second clock signal CLK2 is transmitted via the first insulation element 230A and the first data signal DATA1 is transmitted via the second insulation element 230B. As a result, it becomes feasible to independently operate the path extending from the first transmission circuit 11 to the second reception circuit 22 and the path extending from the second transmission circuit 21 to the first reception circuit 12. Further, an insulation element 330 may be configured by field-coupled capacitors illustrated in FIG. 7, instead of using the magnetically coupled voltage or current transformer illustrated in FIG. 1.

Further, in the above-described first to third embodiments, the determination with respect to the reception of each of the first clock signal CLK1 and the third clock signal CLK3 is performed by detecting the positive edge of the voltage or current pulse. Alternatively, the determination with respect to the reception of each clock signal may be performed by detecting a negative edge (falling edge) of the voltage or current pulse, or both of the positive edge and the negative edge.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Above embodiments can be described as follows:

[1] An electronic circuitry comprising:
  a first circuit capable of transmitting and receiving signals;
  a second circuit capable of transmitting and receiving signals; and
  an insulation element that electrically insulates the first circuit and the second circuit, and is capable of transmitting a signal received from one of the first and second circuits to the other, wherein
  the first circuit has a first terminal to which a first clock signal is input, increases a frequency of the first clock signal to generate a second clock signal, and transmits the second clock signal,
  the insulation element transmits the second clock signal obtained from the first circuit to the second circuit as a third clock signal,
  the second circuit transmits a first data signal in response to the third clock signal obtained from the insulation element,
  the insulation element transmits the first data signal obtained from the second circuit as a second data signal, and the first circuit receives the second data signal from the insulation element.

[2] The electronic circuitry according to [1], wherein
the first circuit has a first transmission mode and a first reception mode,
the first circuit is switched to the first transmission mode when the first clock signal is input and transmits the second clock signal, and is switched to the first reception mode when the transmission of the second clock signal has completed, and
the first circuit receives the second data signal from the insulation element in the first reception mode.

[3] The electronic circuitry circuit according [2], wherein
the first circuit has a first transmission circuit and a first reception circuit,
in the first transmission mode, the first transmission circuit is in an operation state in which operation power is supplied to a circuit portion configured to perform signal transmission included in the first transmission circuit, and the first reception circuit is in a stop state in which no operation power is supplied to a circuit portion configured to perform signal reception included in the first reception circuit, and
in the first reception mode, the first transmission circuit is in the stop state and the first reception circuit is in the operation state.

[4] The electronic circuitry according to [3], wherein
the first circuit is switched to the first reception mode after a predetermined switching time has elapsed since completion of the transmission of the second clock signal.

[5] The electronic circuitry according to [3] or [4], wherein
the first circuit is switched to a first standby mode in response to reception of the second data signal from the insulation element in the first reception mode, and
each of the first transmission circuit and the first reception circuit is in the stop state in the first standby mode.

[6] The electronic circuitry according to any of [1] to [5], wherein
the second circuit has a second transmission mode and a second reception mode,
the second circuit is switched to the second transmission mode in response to reception of the third clock signal from the insulation element in the second reception mode, and
the second circuit transmits the first data signal in the second transmission mode and is switched to the second reception mode when the transmission of the first data signal has completed.

[7] The electronic circuitry according to [6], wherein
the second circuit has a second transmission circuit and a second reception circuit,
in the second transmission mode, the second transmission circuit is in an operation state in which operation power is supplied to a circuit portion configured to perform signal transmission included in the second transmission circuit, and the second reception circuit is in a stop state in which no operation power is supplied to a circuit portion configured to perform signal reception included in the second reception circuit, and
in the second reception mode, the second transmission circuit is in the stop state and the second reception circuit is in the operation state.

[8] The electronic circuitry according to [7], wherein
the second circuit is switched to the second transmission mode after a predetermined standby time has elapsed since completion of the reception of the third clock signal.

[9] The electronic circuitry according to any of [6] to [8], wherein
the second circuit is switched to the second reception mode when the second transmission mode continues for a predetermined time.

[10] The electronic circuitry according to [9], wherein
the second circuit further has a timer circuit that counts a time in response to switching to the second transmission mode, and is switched to the second reception mode when the elapse of the predetermined time is detected by the timer circuit.

[11] The electronic circuitry according to any of [1] to [10], wherein
the insulation element is a single insulation element, and each of the second clock signal and the first data signal is transmitted by the single insulation element.

[12] The electronic circuitry according to any of [1] to [10], wherein
the insulation element includes a first insulation element and a second insulation element, and
the second clock signal is transmitted by the first insulation element, and the first data signal is transmitted by the second insulation element.

[13] The electronic circuitry according to any of [1] to [12], wherein
the insulation element is configured by a voltage transformer, a current transformer, or a capacitor.

[14] The electronic circuitry according to any of [1] to [13], wherein
the second clock signal, the third clock signal, the first data signal, and the second data signal are respectively a voltage pulse or a current pulse.

[15] The electronic circuitry according to any of [1] to [14], wherein
the first circuit determines the reception of the first clock signal by detecting a positive edge, a negative edge, or both of the positive edge and the negative edge of the first clock signal, and
the second circuit determines the reception of the third clock signal by detecting a positive edge, a negative edge or both of the positive edge and the negative edge of the third clock signal.

[16] The electronic circuitry according to any of [1] to [15], further comprising
a signal processing circuit that supplies a data signal to the second circuit, wherein
the second circuit generates a fourth clock signal by reducing the frequency of the third clock signal, and inputs the fourth clock signal to the signal processing circuit,
the signal processing circuit supplies the data signal in synchronization with the fourth clock signal input from the second circuit, and
the second circuit generates the first data signal by increasing the frequency of the data signal supplied from the signal processing circuit.

[17] The electronic circuitry according to [16], wherein
the signal processing circuit has an A/D converter.

[18] The electronic circuitry according to [17], wherein
the A/D converter is configured by a delta-sigma modulator.

The invention claimed is:

1. An electronic circuitry comprising:
a first circuit capable of transmitting and receiving signals;
a second circuit capable of transmitting and receiving signals; and
an insulation element that electrically insulates the first circuit and the second circuit, and is capable of transmitting a signal received from one of the first and second circuits to the other, wherein
the first circuit has a first terminal to which a first clock signal is input, increases a frequency of the first clock signal to generate a second clock signal, and transmits the second clock signal,
the insulation element transmits the second clock signal obtained from the first circuit to the second circuit as a third clock signal,
the second circuit transmits a first data signal in response to the third clock signal obtained from the insulation element,
the insulation element transmits the first data signal obtained from the second circuit as a second data signal, and
the first circuit receives the second data signal from the insulation element,
the first circuit has a first transmission mode and a first reception mode,
the first circuit is switched to the first transmission mode when the first clock signal is input and transmits the second clock signal, and is switched to the first reception mode when the transmission of the second clock signal has completed, and
the first circuit receives the second data signal from the insulation element in the first reception mode.

2. The electronic circuitry according to claim 1, wherein
the first circuit has a first transmission circuit and a first reception circuit,
in the first transmission mode, the first transmission circuit is in an operation state in which operation power is supplied to a circuit portion configured to perform signal transmission included in the first transmission circuit, and the first reception circuit is in a stop state in which no operation power is supplied to a circuit portion configured to perform signal reception included in the first reception circuit, and
in the first reception mode, the first transmission circuit is in the stop state and the first reception circuit is in the operation state.

3. The electronic circuitry according to claim 2, wherein
the first circuit is switched to the first reception mode after a predetermined switching time has elapsed since completion of the transmission of the second clock signal.

4. The electronic circuitry according to claim 2, wherein
the first circuit is switched to a first standby mode in response to reception of the second data signal from the insulation element in the first reception mode, and
each of the first transmission circuit and the first reception circuit is in the stop state in the first standby mode.

5. The electronic circuitry according to claim 1, wherein
the second circuit has a second transmission mode and a second reception mode,
the second circuit is switched to the second transmission mode in response to reception of the third clock signal from the insulation element in the second reception mode, and
the second circuit transmits the first data signal in the second transmission mode and is switched to the second reception mode when the transmission of the first data signal has completed.

6. The electronic circuitry according to claim 5, wherein
the second circuit has a second transmission circuit and a second reception circuit,
in the second transmission mode, the second transmission circuit is in an operation state in which operation power is supplied to a circuit portion configured to perform signal transmission included in the second transmission circuit, and the second reception circuit is in a stop state in which no operation power is supplied to a circuit portion configured to perform signal reception included in the second reception circuit, and
in the second reception mode, the second transmission circuit is in the stop state and the second reception circuit is in the operation state.

7. The electronic circuitry according to claim 6, wherein
the second circuit is switched to the second transmission mode after a predetermined standby time has elapsed since completion of the reception of the third clock signal.

8. The electronic circuitry according to claim 5, wherein
the second circuit is switched to the second reception mode when the second transmission mode continues for a predetermined time.

9. The electronic circuitry according to claim 8, wherein
the second circuit further has a timer circuit that counts a time in response to switching to the second transmission mode, and is switched to the second reception mode when the elapse of the predetermined time is detected by the timer circuit.

10. The electronic circuitry according to claim 1, wherein
the insulation element is a single insulation element, and each of the second clock signal and the first data signal is transmitted by the single insulation element.

11. The electronic circuitry according to claim 1, wherein
the insulation element includes a first insulation element and a second insulation element, and
the second clock signal is transmitted by the first insulation element, and the first data signal is transmitted by the second insulation element.

12. The electronic circuitry according to claim 1, wherein
the insulation element is configured by a voltage transformer, a current transformer, or a capacitor.

13. The electronic circuitry according to claim 1, wherein
the second clock signal, the third clock signal, the first data signal, and the second data signal are respectively a voltage pulse or a current pulse.

14. The electronic circuitry according to claim 1, wherein
the first circuit determines the reception of the first clock signal by detecting a positive edge, a negative edge, or both of the positive edge and the negative edge of the first clock signal, and
the second circuit determines the reception of the third clock signal by detecting a positive edge, a negative edge or both of the positive edge and the negative edge of the third clock signal.

15. The electronic circuitry according to claim 1, further comprising
a signal processing circuit that supplies a data signal to the second circuit, wherein
the second circuit generates a fourth clock signal by reducing the frequency of the third clock signal, and inputs the fourth clock signal to the signal processing circuit, the signal processing circuit supplies the data signal in synchronization with the fourth clock signal input from the second circuit, and the second circuit generates the first data signal by increasing the frequency of the data signal supplied from the signal processing circuit.

16. The electronic circuitry according to claim 15, wherein
the signal processing circuit has an A/D converter.

17. The electronic circuitry according to claim 16, wherein
the A/D converter is configured by a delta-sigma modulator.

18. An electronic circuitry comprising:
a first circuit capable of transmitting and receiving signals;
a second circuit capable of transmitting and receiving signals; and
an insulation element that electrically insulates the first circuit and the second circuit, and is capable of transmitting a signal received from one of the first and second circuits to the other, wherein
the first circuit has a first terminal to which a first clock signal is input, increases a frequency of the first clock signal to generate a second clock signal, and transmits the second clock signal, the insulation element transmits the second clock signal obtained from the first circuit to the second circuit as a third clock signal, the second circuit transmits a first data signal in response to the third clock signal obtained from the insulation element, the insulation element transmits the first data signal obtained from the second circuit as a second data signal, and the first circuit receives the second data signal from the insulation element, the electronic circuitry comprises a signal processing circuit that supplies a data signal to the second circuit, the second circuit generates a fourth clock signal by reducing the frequency of the third clock signal, and inputs the fourth clock signal to the signal processing circuit, the signal processing circuit supplies the data signal in synchronization with the fourth clock signal input from the second circuit, and the second circuit generates the first data signal by increasing the frequency of the data signal supplied from the signal processing circuit.

* * * * *